United States Patent
Schaaf et al.

(10) Patent No.: US 8,505,198 B2
(45) Date of Patent: Aug. 13, 2013

(54) METHOD FOR MANUFACTURING AN ELECTRONIC ASSEMBLY

(75) Inventors: Ulrich Schaaf, Kaiserbach (DE); Andreas Kugler, Alfdorf (DE)

(73) Assignee: Robert Bosch GmbH, Stuttgart (DE)

( * ) Notice: Subject to any disclaimer, the term of this patent is extended or adjusted under 35 U.S.C. 154(b) by 64 days.

(21) Appl. No.: 12/999,834

(22) PCT Filed: May 25, 2009

(86) PCT No.: PCT/EP2009/056286
§ 371 (c)(1),
(2), (4) Date: Mar. 3, 2011

(87) PCT Pub. No.: WO2009/153129
PCT Pub. Date: Dec. 23, 2009

(65) Prior Publication Data
US 2011/0138620 A1    Jun. 16, 2011

(30) Foreign Application Priority Data

Jun. 19, 2008 (DE) .................. 10 2008 002 532

(51) Int. Cl.
*H05K 3/30* (2006.01)
(52) U.S. Cl.
USPC .................. 29/832; 29/830; 29/852; 174/260; 174/262
(58) Field of Classification Search
USPC .................. 29/825, 830, 832, 852; 174/260, 174/262
See application file for complete search history.

(56) References Cited

U.S. PATENT DOCUMENTS

| 5,401,688 | A | 3/1995 | Yamaji et al. |
| 6,113,730 | A * | 9/2000 | Ohya et al. .................. 156/307.3 |
| 6,512,182 | B2 | 1/2003 | Takeuchi et al. |
| 6,784,530 | B2 | 8/2004 | Sugaya et al. |
| 6,928,726 | B2 * | 8/2005 | Zollo et al. ..................... 29/832 |
| 7,419,382 | B2 | 9/2008 | Suzuki et al. |
| 2003/0137045 | A1 | 7/2003 | Sugaya et al. |
| 2005/0006142 | A1 | 1/2005 | Ishimaru et al. |
| 2005/0218491 | A1 | 10/2005 | Sasaki et al. |
| 2007/0099449 | A1 | 5/2007 | Suzuki et al. |

FOREIGN PATENT DOCUMENTS

| CN | 1702857 | 11/2005 |
| DE | 198 30 540 | 1/2000 |
| DE | 10 2005 003 125 | 7/2006 |
| DE | 10 2006 055 576 | 5/2008 |
| EP | 1 050 078 | 11/2000 |
| JP | 2000-151057 | 5/2000 |

* cited by examiner

*Primary Examiner* — Carl Arbes
(74) *Attorney, Agent, or Firm* — Kenyon & Kenyon LLP

(57) ABSTRACT

A method for manufacturing an electronic assembly, including at least one electronic component and a circuit trace structure, by which the at least one electronic component is contacted. In the method, a conductive foil is patterned in a first step to form the circuit trace structure. In a second operation, the circuit trace structure is equipped with the at least one electronic component. In a final operation, another foil is laminated onto the conductive foil equipped with the at least one electronic component on the side on which the conductive foil is equipped with the at least one electronic component.

14 Claims, 3 Drawing Sheets

METHOD FOR MANUFACTURING AN ELECTRONIC ASSEMBLY

FIELD OF THE INVENTION

The present invention relates to a method for manufacturing an electronic assembly, including at least one electronic component and a circuit trace structure, by which the at least one electronic component is contacted.

BACKGROUND INFORMATION

Electronic components used for manufacturing the electronic assembly are integrated circuits (IC) for example. These are accommodated in a substrate, for example in order to encapsulate them and to increase the surface area utilization on the electronic circuit carrier. This makes it possible to protect the electronic components. U.S. Pat. No. 6,512,182, for example, discusses cutting receptacles into a circuit board substrate, into which the electronic components are inserted. Once the electronic components have been inserted, the receptacles are filled, then smoothed and laminated over. Embedding the electronic components makes it possible to achieve a smooth surface of the electronic assembly.

A disadvantage of this assembly is that initially receptacles are cut into the circuit board substrate, into which the electronic components inserted. This makes it very difficult to position the electronic components precisely.

German patent document DE-A 10 2005 003 125 discusses a method for manufacturing an electrical circuit, which has electrical components that are mechanically interconnected by a molding compound. On at least one side of the molding compound, at least one layer of circuit traces is provided, which connects the components to one another electrically. To manufacture the circuit, the components are mounted on a carrier foil and subsequently encapsulated by a molding compound. The carrier foil is subsequently removed, and on the side, on which the components were joined to the carrier foil, one or more layers of circuit traces are applied, which electrically connect the components to one another. In order to achieve a functional wiring of the electrical circuit, however, the carrier foil must be removed without residue.

Additional disadvantages of the electronic assemblies known from the related art are their comparatively great thickness due to the circuit board substrate used. Furthermore, the electronic assemblies manufactured according to the related art are rigid and not deformable. If the electronic assembly is to be used in an item of clothing for example, for example as a transmitter in order find persons buried by avalanches or also as theft protection, it is desirable to use flexible electronic assemblies that are able to adapt to a movement of the item of clothing.

SUMMARY OF THE INVENTION

A method according to the present invention for manufacturing an electronic assembly, including at least one electronic component and a circuit trace structure, by which the at least one electronic component is contacted, includes the following steps:
(a) structuring a conductive foil to form the circuit trace structure,
(b) equipping the circuit trace structure with the at least one electronic component,
(c) laminating another foil onto the conductive foil equipped with the at least one electronic component on the side on which the conductive foil is equipped with the at least one electronic component.

By laminating the foil onto the conductive foil equipped with the at least one electronic component on the side on which the conductive foil is equipped with the at least one electronic component, the component is completely encapsulated. A high reliability, in particular of sensitive components, is thereby achieved.

Components, with which the circuit trace structure is equipped, are for example integrated circuits (IC), batteries, solar modules or other electronic components known to one skilled in the art, which are typically used for manufacturing electronic assemblies. By patterning the conductive foil, which is equipped with the at least one electronic component, and by subsequently laminating on a second foil, a flexible laminate is achieved. In addition, when using a foil for example from a thermoplastic material, it is possible to manufacture deformable assemblies. In this instance, the thermoplastic foil is for example the additional foil laminated on the conductive foil, or a deformable, for example thermoplastic foil is used as the carrier foil, which is connected to the conductive foil.

In one specific embodiment, the additional foil, which is laminated on the conductive foil equipped with the at least one electronic component, is also a conductive foil, which is equipped with at least one electronic component. The lamination may occur in such a way that the electronic components of the two foils face each other such that the conductive foils are located on the outside of the laminate. In this manner, the surface area utilization may be increased markedly. In order to prevent the lamination of the additional foil on the conductive foil from producing undesired electrical connections, a layer made of a dielectric material may be inserted between the two conductive foils. The layer inserted between the two conductive foils may be a plastic layer. A thermoplastic is used as the plastic for example. It is also possible, however, to use any other plastic. The layer that is introduced between the two conductive foils may be used to fix the components in place and to ensure the contacting.

In order to insert the plastic layer between the two conductive foils, it is possible for example to apply a plastic coating on the conductive foil prior to equipping it with the at least one electronic component. The plastic coating may be applied prior to or after patterning the foil to form the circuit trace structure. The application of the plastic coating prior to patterning the conductive foil has the advantage that, because of the plastic layer, a continuous base is preserved, on which the metal layer is patterned. As a result, individual circuit traces will not be shifted or bent for example by careless handling. By contrast, if the conductive foil is not provided with a plastic layer, it is necessary to leave the conductive foil on a carrier, it then being necessary to handle the patterned foil so carefully that individual circuit traces of the structure do not shift or bend.

Alternatively, however, it is also possible for example to apply the plastic layer onto the foil only after equipping the conductive foil, on the side on which the at least one electronic component is positioned. Furthermore, it is also possible to apply another plastic layer onto the foil after equipping the conductive foil. For this purpose, the plastic coating, which was applied prior to equipping the conductive foil, may be situated on the side on which the foil was equipped with the electronic components or on the side of the foil facing away from the components.

If the additional foil, that is, the foil laminated onto the conductive foil equipped with the at least one electronic component, is likewise a conductive foil, then in one specific embodiment it is possible to introduce vias for connecting the circuit trace structures patterned out of the conductive foils. The vias may be introduced for example by creating bores, which are subsequently metallized. Alternatively, it is also possible to manufacture the vias for example by a deep drawing process, in which the upper layer of the conductive foil is pressed by a mandrel through the dielectric until it contacts the lower conductive foil.

In order to prevent undesired contacts on the conductive foil, which result in a malfunction of the electronic assembly for example, an insulating layer may be applied on at least one of the outward facing sides of the electronic assembly. In insulating layer is usually made of a dielectric material. Plastics are especially suitable as insulating layers. Particularly if the electronic assembly is to be deformed, it is advantageous if the insulating layer is made from a thermoplastic material.

Aside from the use of thermoplastic plastics or thermosetting plastics, it is alternatively also possible to use for example elastomers or stretchable silicones for the dielectric and, if applicable, the at least one insulating layer. By using elastomers or stretchable silicones in combination with suitably designed circuit trace structures it is possible to produce electronic circuits that are flexible in all spatial directions. In particular, such electronic assemblies may also be stretched. When stretching or bending plastically deformable materials, a reshaping force must generally be applied and the electronic assembly must possibly be heated.

In one specific embodiment of the present invention, at least two electronic assemblies are connected to each other to form a laminate. It is also possible to connect more than only two layers of the circuit trace structures equipped with electronic components by the laminate. For this purpose, the individual layers may be electrically contacted with one another by vias.

If a laminate is to be manufactured from more than two layers, it is also possible to equip an electrically conductive foil on its upper side and on its lower side respectively with at least one electronic component. In this case, additional foils are laminated both on the upper side as well as on the lower side of the electrically conductive foil.

Furthermore, it is also possible to interconnect multiple foils equipped on both sides with respectively at least one electronic component to form a laminate. In this case, a dielectric is inserted respectively between two foils. As already mentioned previously, the dielectric is a plastic or a silicone for example.

In order to achieve an improved encapsulation of the electronic component, the electronic component additionally may be enclosed using a molding compound. By enclosing the component using a molding compound, an additional stabilization of the electronic component and the contacting may be achieved for example such that it does not break for example when bending the electronic assembly.

In one specific embodiment, the electronic assembly in a final step is reshaped into a molded part. The reshaping may occur for example by deep drawing or other reshaping methods.

Reshaping is possible in particular if a reshapable material is used as the dielectric. In order to avoid damaging electronic components, with which the foil is equipped, in the reshaping process, it is possible on the one hand to design the equipment in such a way that no electronic components are applied on bending locations or folding locations of the molded part. Alternatively, however, it is also possible to use flexible electronic components, which may be bent for example.

Using the method according to the present invention it is possible to achieve a cost-effective wiring and encapsulation by using processes on many modules simultaneously and a reel-to-reel manufacture. It is moreover possible to process the electronic assembly further as a standard component for example. In the method according to the present invention, the electronic components are contacted during assembly. This requires fewer process steps than in the methods known from the related art.

Another advantage is that cost-effective plastics are used as the dielectric. Such plastics are known to one skilled in the art from RFIDs for example. These plastics may be used in particular in applications in the low temperature range.

In particular by using flexible electronics it is possible to manufacture completely flexible and deformable circuits using the method according to the present invention. If plastically deformable circuit carriers are used, the electronic component, which is reshaped in a final step into a molded part, may also be used as a housing part, for example. The housing parts may be connected to the actual housing by bonding or stamping and contacted if required.

Specific embodiments of the present invention are shown in the drawing and are explained in more detail in the following description.

DETAILED DESCRIPTION

FIGS. 1 through 7 show individual method steps for manufacturing an electronic component developed in accordance with the exemplary embodiments and/or exemplary methods of the present invention.

Figure 1:
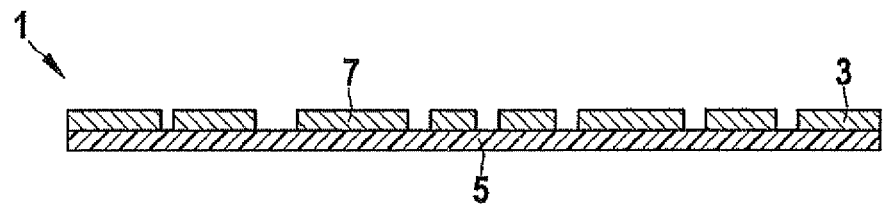
FIG. 1 shows a step(s) of a method for manufacturing an electronic assembly.

In a first step, which is shown in FIG. 1, an electrically conductive foil 1 is patterned so as to develop a circuit trace structure. The patterning is performed only on an electrically conductive layer 3 of electrically conductive foil 1. In the specific embodiment shown here, electrically conductive layer 3 is applied on an electrically non-conductive layer 5. Electrically non-conductive layer 5 acts as a carrier layer and is not patterned. Electrically non-conductive layer 5 is a plastic layer for example. Particularly metals, for example copper or silver, are suitable as electrically conductive layer 3. Furthermore, gold, palladium or laminates, for example NiPdAu, are suitable as well. Electrically non-conductive layer 5 may be applied on electrically conductive layer 3 by laminating or spreading by squeegee blade for example. The application of electrically non-conductive layer 5 may be performed either after patterning electrically conductive layer 3 or prior to patterning electrically conductive layer 3.

Alternatively it is also possible to use an electrically conductive foil 1 for example, which has only an electrically conductive layer 3. In this case it becomes necessary, however, to lay electrically conductive foil 1, which has only electrically conductive layer 3, onto a carrier material in order to prevent the individual circuit traces from shifting after patterning circuit trace structure 7.

After patterning the circuit trace structure from electrically conductive layer 3 of electrically conductive foil 1, electrically conductive foil 1 is equipped with electronic components 9. Electrically conductive foil 1 is equipped using flip-chip technology for example. For this purpose, contact points 11 (bumps) are attached to electronic components 9. Contact points 11 are pressed through the electrically non-conductive layer such that they contact circuit trace structure 7, which was patterned from electrically conductive layer 3. Electrically non-conductive layer 5 may be used at the same time as a connecting medium. For this purpose, it is possible for example to use an adhesive coating as electrically non-conductive layer 5.

The connection of contact points 11 with circuit trace structure 7 is performed for example by a temperature and pressure process, for example by so-called heat sealing. Furthermore, an NCA (non-conductive adhesive) process is also suitable. Alternatively, it is also possible for example to contact electronic components 9 by a soldering process to circuit trace structure 7. For this purpose, acids contained in electrically non-conductive layer 5 may act as flux for the soldering process. An epoxy resin is also suitable in this case as a material for electrically non-conductive layer 5.

If electrically conductive fail 1 is made up only of electrically conductive layer 3 and no electrically non-conductive layer 5 is provided, then it is possible to solder electronic components 9 first by contact points 11 onto circuit trace structure 7 and subsequently to underfill electronic component 9 with an adhesive. Alternatively, so-called ICA bonding (isotropic conductive adhesive) is also possible.

Figure 2:
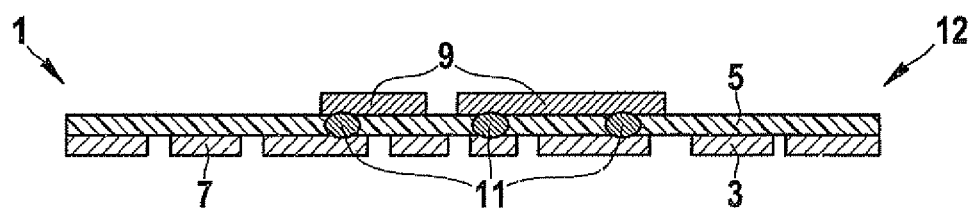
FIG. 2 shows another step(s) of a method for manufacturing an electronic assembly.
Figure 3:
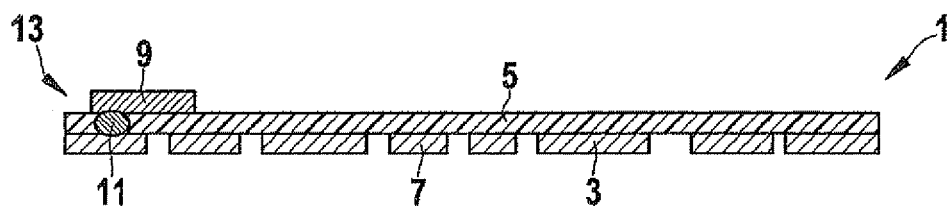
FIG. 3 shows another step(s) a method for manufacturing an electronic assembly.

A second carrier strip 13 may optionally also be manufactured in the same manner as shown in FIGS. 1 and 2. Second carrier strip 13 likewise includes a conductive foil 1 having an electrically conductive layer 3, from which a circuit trace structure 7 was patterned, and an electrically non-conductive layer 5. In another structure, at least one electronic component 9, which is provided with a contact point 11, is applied on electrically non-conductive layer 5. Contact point 11 is pressed through electrically non-conductive layer 5 and establishes contact between electronic component 9 and circuit trace structure 7. First carrier strip 12 and second carrier strip 13 thus manufactured may later be connected to each other to form a laminate. In this case, the equipment and structure of the circuit traces of first carrier strip 12 and second carrier strip 13 usually differs. Thus it is also possible, for example, that only one of the two carrier strips 12, 13 is equipped with the at least one electronic component 9 and the other carrier strip 13, 12 is unequipped.

Figure 4:
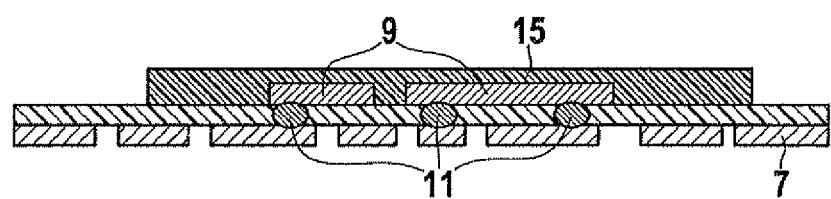
FIG. 4 shows another step(s) of a method for manufacturing an electronic assembly.

An additional stabilization of electronic components 9 may be achieved for example by enclosing them in a molding compound 15, as shown in FIG. 4. Enclosing electronic components 9 in molding compound 15 is only necessary, however, if electronic components 9 are very sensitive or if for example the carrier strap is to be bent without bending the electronic components in the process. In this case, molding compound 15 provides additional mechanical stabilization.

Figure 5:
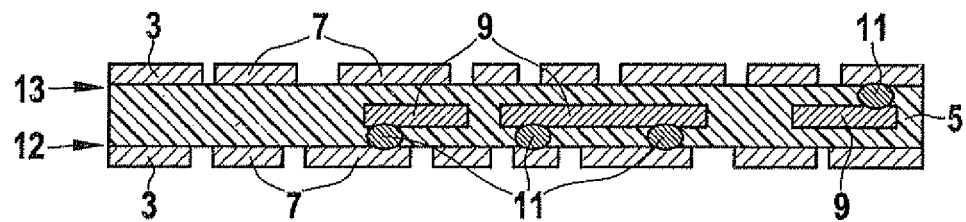
FIG. 5 shows another step(s) of a method for manufacturing an electronic assembly.
Figure 6:
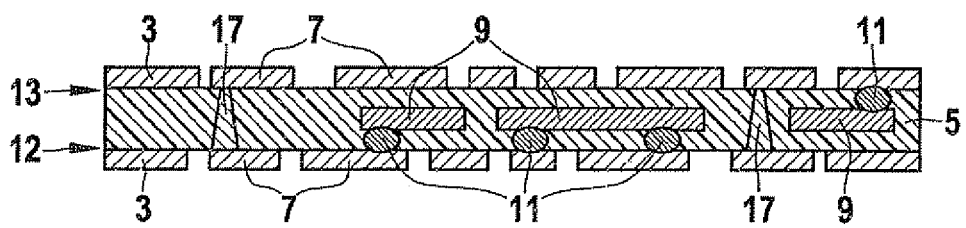
FIG. 6 shows another step(s) of a method for manufacturing an electronic assembly.

Second carrier strip 13 connected to first carrier strip 12 is shown in FIG. 5. In this instance, first carrier strip 12 and second carrier strip 13 are connected to each other in such a way that the electrically conductive layer 3 of the two carrier strips 12, 13 respectively lies on the outside. Electrically non-conductive layer 5 of first carrier strip 12 and of second carrier strip 13 forms a dielectric, which prevents electrically conductive layers 3, which form circuit trace structure 7, from contacting each other in undesired locations. In order to achieve a uniform layer thickness it is possible to introduce another dielectric, which also encloses electronic components 9, in addition to electrically non-conductive layer 5, which was already applied on electrically conductive layer 3. Carrier strip 12, 13 is connected by a customary laminating process known to one skilled in the art.

If two electrically conductive foils 1 are to be connected to each other, which respectively have no electrically non-conductive layer 5, then a dielectric is applied onto at least one of the two carrier strips 12, 13 prior to laminating the second carrier strip 13 onto first carrier strip 12. In this case, a plastic film is suitable as dielectric. In this case, the two carrier strips 12, 13 are laminated together with the plastic film in between.

As an alternative to laminating second carrier strip 13 onto first carrier strip 12, it is also possible for example to laminate a dielectric onto first carrier strip 12 and to provide only one conductive layer. It is furthermore possible to apply a dielectric also on the outside of electrically conductive layer 3 and to laminate another electrically conductive layer on it. In this instance, for example, at least one electronic element 9 may also be situated respectively on the upper side and on the lower side of electrically conductive layer 3. In this case, it may furthermore be provided that electrically conductive layer 3, after having been patterned into circuit trace structure 7, is also provided with an electrically non-conductive layer on the second side.

After laminating second carrier strip 13 onto first carrier strip 12, circuit trace structures 7, which were patterned from electrically conductive layers 3, may be connected to each other by vias 17. Vias 17 may be produced for example by introducing bores into the circuit carrier and subsequently metallizing the bores. Alternatively, it is also possible, for example, for the electrically conductive layer 3 of one of the two carrier strips 12, 13 to be pressed over a mandrel through the dielectric, which is formed by electrically non-conductive layer 5, until it contacts second electrically conductive layer 3.

After connecting first carrier strip 12 with second carrier strip 13, an insulating layer 19 may be applied on the outside. Insulating layer 19 prevents electrically conductive parts from being outwardly exposed. As insulating layer 19, a plastic film for example may be applied onto the laminate made up of first carrier strip 12 and second carrier strip 13. Alternatively it is also possible to apply a plastic layer by any other method onto the laminate.

If only one electrically conductive layer 3 is included, then it suffices to apply insulating layer 19 on outwardly facing electrically conductive layer 3.

Insulating layer 19, which is applied on the outside of the laminate, may be optionally patterned, for example to be able to attach plug connectors or cables. The electronic assembly may thereby be contacted.

Figure 7:
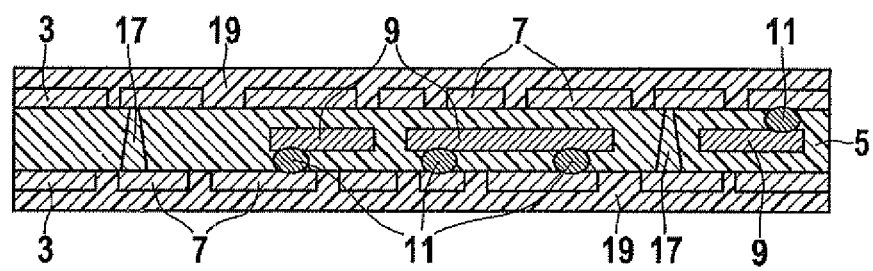
FIG. 7 shows another step(s) of a method for manufacturing an electronic assembly.

After applying insulating layer 19 it is furthermore possible to apply additional carrier strips, which respectively include electrically conductive layers 3, which are in contact with electronic components 9. Furthermore it is also possible to connect multiple electronic assemblies with one another by lamination for example, as shown in FIG. 7.

Figure 8:
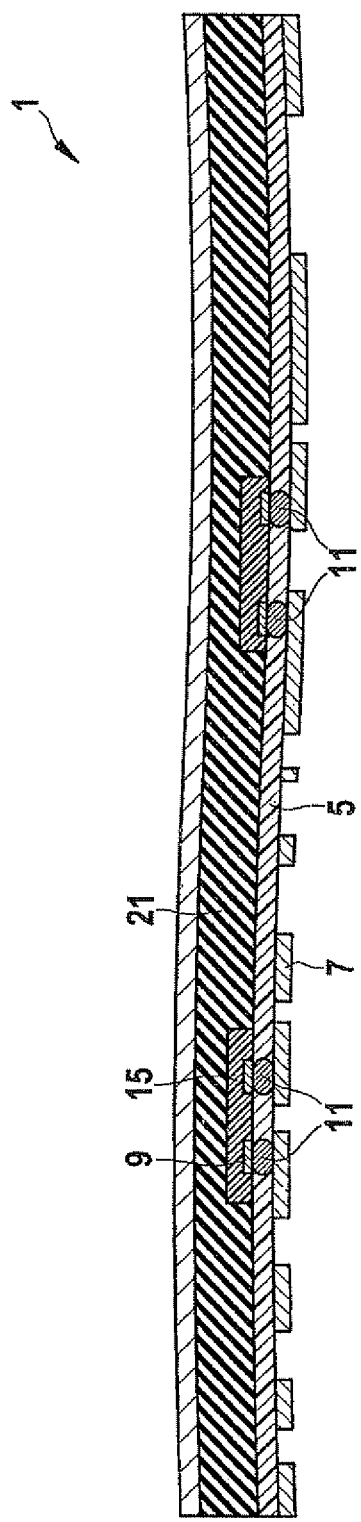
FIG. 8 shows an electronic assembly manufactured according to the present invention.

After manufacturing the laminate, the latter may be stamped into any shape. Alternatively it is also possible to produce a flexible foil-like circuit for example. This is shown in FIG. 8. For this purpose, electronic components 9, which are enclosed in molding compound 15 in order to protect them against damage, are applied on an electrically conductive foil that was patterned into a circuit trace structure 7. Subsequently, a dielectric 21 is applied onto the layer in order to achieve a uniform layer thickness and a further encapsulation of electronic components 9. As the material for dielectric 21, a material is chosen that is flexible and allows for the laminate to be deformed. Such a flexible foil-like circuit may be used in items of clothing for example. Such electronics integrated into clothing is suitable for example in skier equipment or mountaineer equipment for example in order to be able to find a wearer of such an item of clothing, who was possible buried by an avalanche. Alternatively, the electronics may also be used as theft protection for example. It is also possible to store product information on a respective circuit for example.

If the circuit is not used as a flexible foil-like circuit, it is also possible to reshape the laminate into a molded part for example. This is done for example by stamping the laminate, as it is shown in FIG. 7. This makes it possible for example to produce a housing having integrated electronics.

What is claimed is:

1. A method for manufacturing an electronic assembly, including at least one electronic component and a circuit trace structure, by which the at least one electronic component is contacted, the method comprising:
   structuring an electrically conductive layer of a conductive foil on a non-conductive layer to form the circuit trace structure;
   attaching at least one contact point to the at least one electronic component;
   pressing the at least one contact point through the non-conductive layer to electrically connect the at least one electronic component to the electrically conductive layer; and
   laminating another foil onto the conductive foil equipped with the at least one electronic component on the side on which the conductive foil is equipped with the at least one electronic component.

2. The method of claim 1, wherein the additional foil is a conductive foil, which is equipped with at least one electronic component.

3. The method of claim 1, wherein a dielectric is inserted between the two conductive foils.

4. The method of claim 3, further comprising:
   applying a coating made of a dielectric onto the conductive foil prior to equipping it with the at least one electronic component, wherein the coating made of the dielectric is applied one of prior to and after patterning the conductive layer of the conductive foil to form the circuit trace structure.

5. The method of claim 3, wherein after equipping the conductive foil (1), the dielectric is applied on the side of the conductive foil (1), on which the at least one electronic component (9) is positioned.

6. The method of claim 3, wherein the dielectric is a plastic layer.

7. The method of claim 2, wherein vias are introduced for connecting the circuit trace structures patterned from the conductive layer of the conductive foils.

8. The method of claim 1, further comprising:
   applying an insulating layer on at least one outwardly facing side of the electronic assembly.

9. The method of claim 1, wherein at least two electronic assemblies are connected to each other to form a laminate.

10. The method of claim 1, wherein the electrically conductive foil is respectively equipped with at least one electronic component on its upper side and on its lower side.

11. The method of claim 10, wherein multiple conductive foils respectively equipped with at least one electronic component are connected to one another to form a laminate, and wherein a dielectric is inserted respectively between two conductive foils.

12. The method of claim 1, wherein at least one electronic component, with which the conductive foil is equipped, is enclosed in a molding compound.

13. The method of claim 1, wherein the electronic assembly in a final step is reshaped into a molded part.

14. A method for manufacturing an electronic assembly, comprising:
   patterning a first electrically conductive layer on a first non-conductive layer and a second electrically conductive layer on a second non-conductive layer;
   attaching a first contact point to a first electronic component and a second contact point to a second electronic component;
   pressing the respective first and second contact points through the respective first and second non-conductive layers to electrically connect the first electronic component to the first electrically conductive layer through the first non-conductive layer and electrically connect the second electronic component to the second electrically conductive layer through the second non-conductive layer; and
   laminating the first non-conductive layer to the second non-conductive layer such that the first and the second electronic components are positioned between the first electrically conductive layer and the second electrically conductive layer.

* * * * *

UNITED STATES PATENT AND TRADEMARK OFFICE
CERTIFICATE OF CORRECTION

PATENT NO.       : 8,505,198 B2
APPLICATION NO.  : 12/999834
DATED            : August 13, 2013
INVENTOR(S)      : Schaaf et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 137 days.

Signed and Sealed this

Fifteenth Day of September, 2015

Michelle K. Lee
*Director of the United States Patent and Trademark Office*